United States Patent [19]
Salm et al.

[11] Patent Number: 5,991,396
[45] Date of Patent: Nov. 23, 1999

[54] METHOD OF SELECTING CHARACTERS FROM A KEYPAD AND A TELEPHONE SET OPERATING ACCORDING TO THIS METHOD

[75] Inventors: Peter van der Salm, Utrecht; Jan Hendrik Louis Ten Wolde, Enschede, both of Netherlands

[73] Assignee: Telefonaktiebolaget LM Erisson, Stockholm, Sweden

[21] Appl. No.: 08/913,048

[22] PCT Filed: Mar. 8, 1996

[86] PCT No.: PCT/EP96/01099

§ 371 Date: Oct. 9, 1997

§ 102(e) Date: Oct. 9, 1997

[87] PCT Pub. No.: WO96/27947

PCT Pub. Date: Sep. 12, 1996

[30] Foreign Application Priority Data

Mar. 8, 1995 [EP] European Pat. Off. ............. 95200571

[51] Int. Cl.[6] ............................... H04M 1/27; G09G 5/08
[52] U.S. Cl. ......................... 379/355; 379/354; 379/368; 345/145; 345/157
[58] Field of Search .................................. 379/355, 354, 379/356, 368, 352; 341/20, 173; 345/145, 157, 160, 162, 168, 172, 156; 707/3, 5, 6; 708/145, 146

[56] References Cited

U.S. PATENT DOCUMENTS

| | | | |
|---|---|---|---|
| 5,311,175 | 5/1994 | Waldman | 379/368 |
| 5,485,513 | 1/1996 | Goedken et al. | 379/355 |
| 5,509,067 | 4/1996 | Murata | 379/355 |
| 5,594,778 | 1/1997 | Schaupp, Jr. et al. | 379/368 |
| 5,708,804 | 1/1998 | Goodwin et al. | 379/368 |
| 5,754,602 | 5/1998 | Landry et al. | 379/368 |
| 5,798,716 | 8/1998 | Davis | 379/368 |
| 5,815,138 | 9/1998 | Tsubaki et al. | 345/145 |
| 5,847,695 | 12/1998 | Duncan et al. | 379/368 |
| 5,850,212 | 12/1998 | Nishibori | 345/160 |
| 5,896,123 | 4/1999 | Nagahara et al. | 345/145 |
| 5,898,432 | 4/1999 | Pinard | 345/334 |

FOREIGN PATENT DOCUMENTS

| | | |
|---|---|---|
| 079 831 | 5/1983 | European Pat. Off. . |
| 457 077 | 11/1991 | European Pat. Off. . |
| 608 682 | 8/1994 | European Pat. Off. . |
| 56-110144 | 9/1981 | Japan . |
| 1-243759 | 9/1989 | Japan . |
| 2-47958 | 2/1990 | Japan . |
| 3-88086 | 4/1991 | Japan . |
| 2 128 384 | 4/1984 | United Kingdom . |

*Primary Examiner*—Forester W. Isen
*Assistant Examiner*—Jacques M. Saint-Surin
*Attorney, Agent, or Firm*—Burns, Doane, Swecker & Mathis, L.L.P.

[57] ABSTRACT

There is disclosed a method of selecting characters from a group of characters assigned to a single key, in particular a key of a telephone dialling keypad. Actuation of a key (8; 16) invokes a cursor controlled display of the characters (2; 18). The cursor is held at a particular position (11) while a key is actuated within a predetermined time interval ($t_1$; 6, 7). The character string corresponding to a particular key actuation is read (18) and is used for the retrieval of the closest matching data entry from memory means (19). If the key is not further actuated within this time interval ($t_1$), the cursor is moved to a next position (22), provided the selected character string matches any of the data entries of the memory means (20, 21). The retrieved data entry may be used, inter alia, for automatic dialling purposes. The method is applied in a telephone set having memory means containing subscriber data.

18 Claims, 5 Drawing Sheets

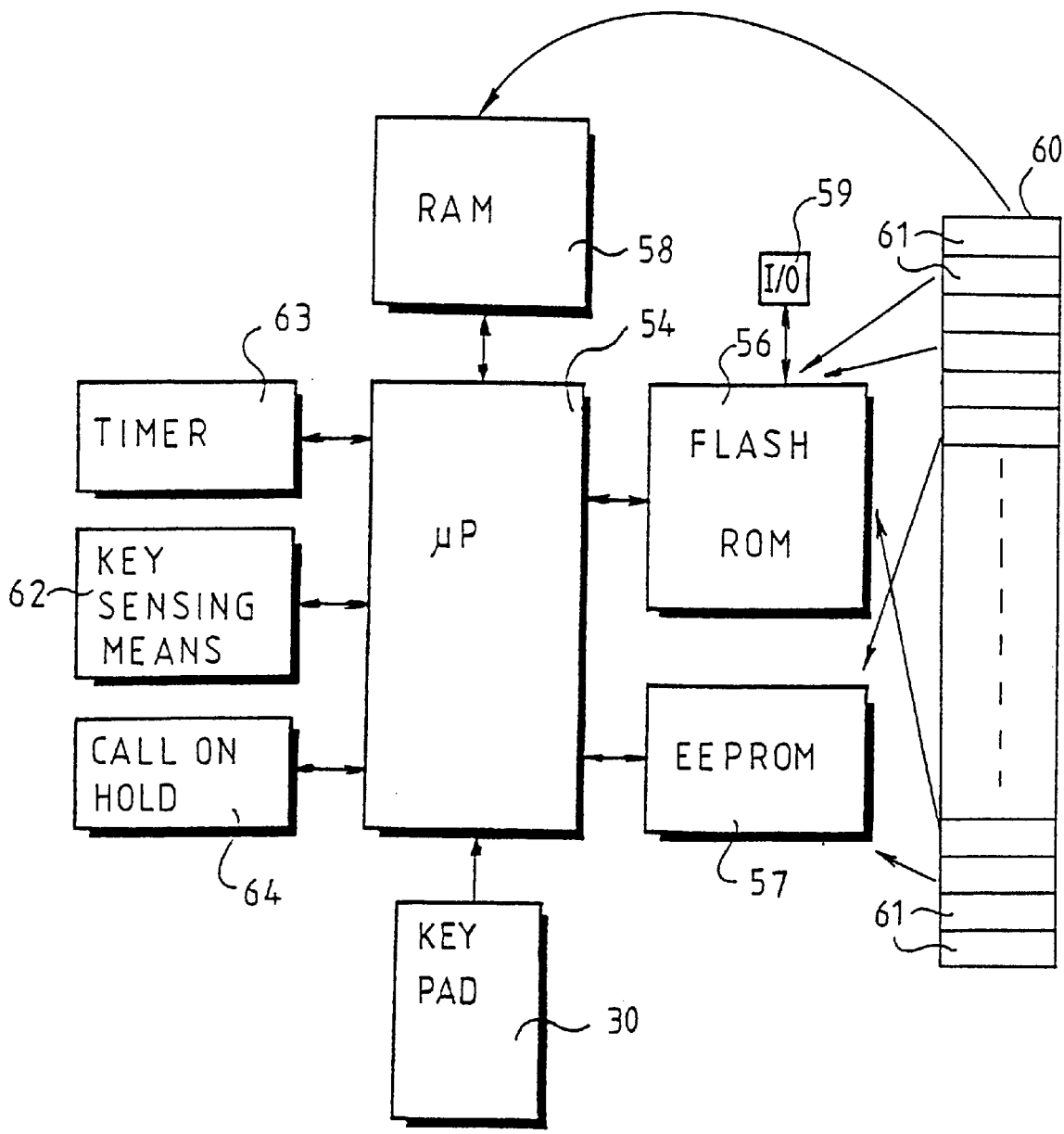

METHOD OF SELECTING CHARACTERS FROM A KEYPAD AND A TELEPHONE SET OPERATING ACCORDING TO THIS METHOD

FIELD OF THE INVENTION

The present invention relates generally to the selection of a character among a group of characters associated with a single key of a keypad means, such as telephone dialling keypad means and more particularly, to the selection of a character string for accessing data stored in memory means, such as telephone system subscriber data stored in a memory of a telephone set.

BACKGROUND OF THE INVENTION

Conventional simple telephone dialling keypad means generally comprise twelve keys or buttons to which ten digits 0–9 and special characters "*" and "#" are assigned. However, in more complex systems also a number of letters and other special characters such as punctuation symbols may be assigned to each key. In these extended keypad means, each key normally represents a group of three or four characters. Extended telephone dialling keypad means are used, inter alia, for storage and retrieval of data representative of names including telephone numbers of subscribers of a telephone system, e.g. a private branch network. Selection of a particular character of a group is established by actuating the corresponding key in a prescribed manner.

European patent application 0,608,682 discloses a keypad means having separate keys for designating the position of a character in a group. To select a character from a group, two keys have to be actuated: i.e. the key to which the relevant group of characters is assigned and a key designating the position of a character in that group.

British patent application 2,128,384 discloses a method for the selection of characters from a group of characters assigned to the keys of an extended telephone keypad by multiple actuation of a key, such that one key pressing represents a first character of the group, two key pressings result in the selection of a second character of the group etc. To discriminate between subsequent key pressings for the selection of a character of a group and the completion of the selection itself, a time delay interval is started each time after the deactivation of a key, i.e. the pressing thereof.

Activation of the key within this time delay contributes to the selection of a character of the group associated with the particular key. Lapse of the time delay interval following the last key pressing will result in displaying the selected character and making the keyboard ready for further inputs.

Although this method of selecting characters from a group of characters assigned to a single key of a keypad means already limits the number of keys which have to be actuated for forming a string of characters, such that no other keys have to be actuated than those to which the particular characters have been assigned, it has been found that this known method is not very suitable in accessing data entries such as telephone system subscriber data stored in a memory of a telephone set, for example. This, because typing errors, which can very easily occur with unexperienced users of such an extended telephone keypad means, may result in a string not matching any data entry stored in the memory. However, in these cases, the user will be generally notified of his typing errors only after he has completed the search string when he recognizes that there is no matching entry in the memory at all. Accordingly, the user has to start a new selection or has to use an erase key or the like, in order to correct his entry. It will be appreciated that this may not only take a relatively long time before a call can be placed, but will also get very annoying.

SUMMARY OF THE INVENTION

It is an object of the invention to reduce the required number of key pressings of the keys of an extended telephone keypad means for retrieving a particular data entry stored in a memory means.

It is also an object of the invention to speed up the selection of data entries stored in a memory means by minimizing the risk of forming search strings not matching any data entry stored in the memory means.

It is another object of the present invention to provide a telephone set having easy and fast access to data entries stored in a memory of the telephone set, through selection of characters assigned to the telephone dialling keypad means.

These and other objects, advantages and features of the present invention are provided by a method of selecting characters from a group of characters assigned to a single key of a keypad, in particular a key of a telephone dialling keypad, each key of which having a number of alphanumeric and other characters assigned to it, and such that actuation of a key invokes a cursor controlled display of the characters assigned to this key. The cursor is held at its position while a particular key is actuated within a predetermined time interval and is moved automatically to another position if the key is not further actuated within the predetermined time interval, such to form a character string comprising at least one character.

Following the invention, the selection of a character is controlled in connection with accessing character representing data entries stored in memory means. By each actuation of a particular key during the set time interval a data entry is retrieved and displayed which matches as close as possible the selected character string; i.e. having the most characters in common. The cursor will be held at its position if the corresponding character of the selected character string and the retrieved data entry do not match.

Accordingly, movement of the cursor is also controlled by the data entries to be accessed. In case of mismatch, the cursor will not be moved thereby providing the user a direct opportunity to enter a correct character in case of an input error or the like. It will be understood that this will speed up selection because the user receives immediately feedback in case the selected character string will not result in the retrieval of a data entry. By keeping the cursor at its position, the user does not have to use a backspace key, error key or the like to correct his mistake.

By displaying the temporarily closest matching entry, the user can stop the selection once the correct entry has been displayed. Thereby reducing the number of key actuations to a minimum for retrieving a particular entry and again speeding up the selection and retrieval process.

In case of multiple matching entries the first entry of this multiple, viewed in alphabetical order, may be retrieved and displayed. If no entries matching a particular character string can be accessed, it has been found that it is advantageously to retrieve and display the next closest matching data entry stored in the memory means. By this, the user is provided with information as to the content of the memory means with respect to data entries matching the selected character string.

The method of the invention is not limited to a particular type of key actuation such as scrolling through a group of characters by having a key continuously actuated, or by multiple actuation of a key corresponding to the position of a character in a group, for example. Further, it is possible to set a fixed time interval for each character selection, or starting the time interval each time the key is activated or deactivated. Starting the time interval at the deactivation of a key provides the user with the opportunity to control the selection process by keeping a key actuated within the interval set such that the user can take his time to monitor the selection and, if necessary, to select another character of the group, for example.

In the method according to the invention, when the selection of a character is completed, the cursor moves automatically to the next position. In order to speed up selection, in a further embodiment of the method according to the invention, the cursor is automatically moved to its next position in case of actuation of another key. This means that the user of the keypad means does not have to wait for lapse of the set time interval before a next character of a string can be selected.

Although the method according to the invention is very easy to understand and easy to handle, and allows a quick selection of data entries from a memory means or database, for example, some users may desire character selection without memory control. This can be also the case for entering data in the memory means from the keypad, for example.

In order to easily distinguish between character selection with or without memory control, in another embodiment of the invention the memory controlled character selection mode is entered by a time-controlled actuation of a key while the cursor is in its first position.

Thus, for example, by actuation of the first key longer than a set time interval the memory controlled selection mode will be entered automatically. This actuation is also interpreted as the selection of a first character of the group assigned to the particular key. This again minimises the number of keys or the number of times a key has to be actuated for selection purposes.

The invention relates also to a telephone set, in particular a radio telephone set, including processor control means, visual display means and telephone dialling keypad means. Each key of the dialling keypad means having a number of alphanumeric and other characters assigned to it. The processor control means, keypad means and display means are operatively connected such that actuation of a key invokes a cursor controlled display of the characters assigned to this key. The telephone set comprises timer means for setting a predetermined time interval, such that under the control of the processor control means the cursor is held at a particular display position while a key of the keypad means is actuated during this time interval. The cursor is moved to another position if the key is not further actuated within the time interval, as a result of which a character string comprising at least one character is formed.

According to the invention, the telephone set comprises memory means operatively connected to the processor control means for retrieving character data entries by the keypad means. The processor control means are arranged to hold the cursor at its position in case the selected character string does not match any of the data entries.

In a further embodiment of the telephone set according to the invention, the memory means include a first non-volatile memory part allocated to pre-determined data entries, a second non-volatile memory part allocated to data entries by the keypad means, and a third memory part allocated to address data pointing to stored data entries. During operation of the telephone set and dependent upon a selected character string, data entries of the first and second memory part are accessed conditional to the manner in which the address data are stored, e.g. in alphabetical order of the data entries.

By having an address data part pointing to both the first and second memory part, the user of the telephone does not have to make beforehand a selection of data to be retrieved from either the pre-stored first memory part or the second memory part containing the data stored by the user self. For the user of the telephone set it appears as if the data entries are stored in their predetermined—e.g. alphabetical—order in one and the same memory or database.

To support character selection both with and without memory control, in another embodiment according to the invention the telephone set comprises further timer means, such that memory controlled access is entered by actuation of a first key under the control of these further timer means.

In particular, for direct dialling using numerical data, in a yet other embodiment of the invention the processor control means are arranged such that if a key is actuated for character selection without entering the memory control mode, only numeric characters 0–9 and special characters "*" and "#" can be selected by the keys of the keypad means.

The telephone set according to the invention is particularly well suited for use with memory means comprising data entries representing names in an alphabetical order and dialling information of subscribers of a telephone system to which the telephone set is connected. By retrieving a particular name, the stored dialling information can be used for direct, automatic dialling purposes.

By providing the possibility of character selection while a call is in progress, in an embodiment of the telephone set of the invention the call in progress will be automatically put on hold in case of dialling in accordance with the selected character string or a retrieved data entry. With this feature, the number of key actuations is again reduced by omitting the actuation of a key for putting the present call on hold and thereby requesting access to another line of the telephone system, such as a third party line, after which dialling of another subscriber for enquiry purposes or to set up a third party call, can be started. It will be understood that with the telephone set according to the present embodiment, the other or third party line is optimally accessed without any unduly delay between accessing this line and transmitting dialling information.

The telephone set, in further embodiments thereof, is provided with means for sensing actuation of another key for a processor controlled movement of the cursor to its next position in a character string, respectively. This feature again speeds up the selection process, because the user needs not to wait until the time delay has lapsed before actuating a different key.

It will be appreciated that the method according to the invention is not limited to its use with memory means provided in a telephone set, but is also applicable for retrieving data entries from memory means installed in a system or network to which the telephone set is operatively connected.

The above-mentioned and other features and advantageous of the present invention will now be discussed in the following description with reference to the accompanying drawings.

BRIEF DESCRIPTION OF THE DRAWINGS

FIG. 5 shows a block diagram of a memory means, keypad means and processor means operatively connected according to the present invention, inter alia for use in the telephone set shown in FIG. 4.

DETAILED DESCRIPTION OF THE EMBODIMENTS

The method according to the invention will now be further elucidated with reference to keypad means, each key of which having assigned to it a group of three or four characters including digits, letters and other special characters such as punctuation characters. The keypad means are connected to display means and are arranged such that actuating a key once results in a display of a first character of a group, actuating the same key twice will result in the display of the second character of a group etc.

The position of the character on the display is indicated by a cursor. In the preferred embodiment of the invention this cursor takes the form of a blinking selected character. That is to say, the blinking character indicates the current cursor position. It will be understood that any other cursor representation such as a short line, a rectangular patch etc. can be used as well.

Figure 1:
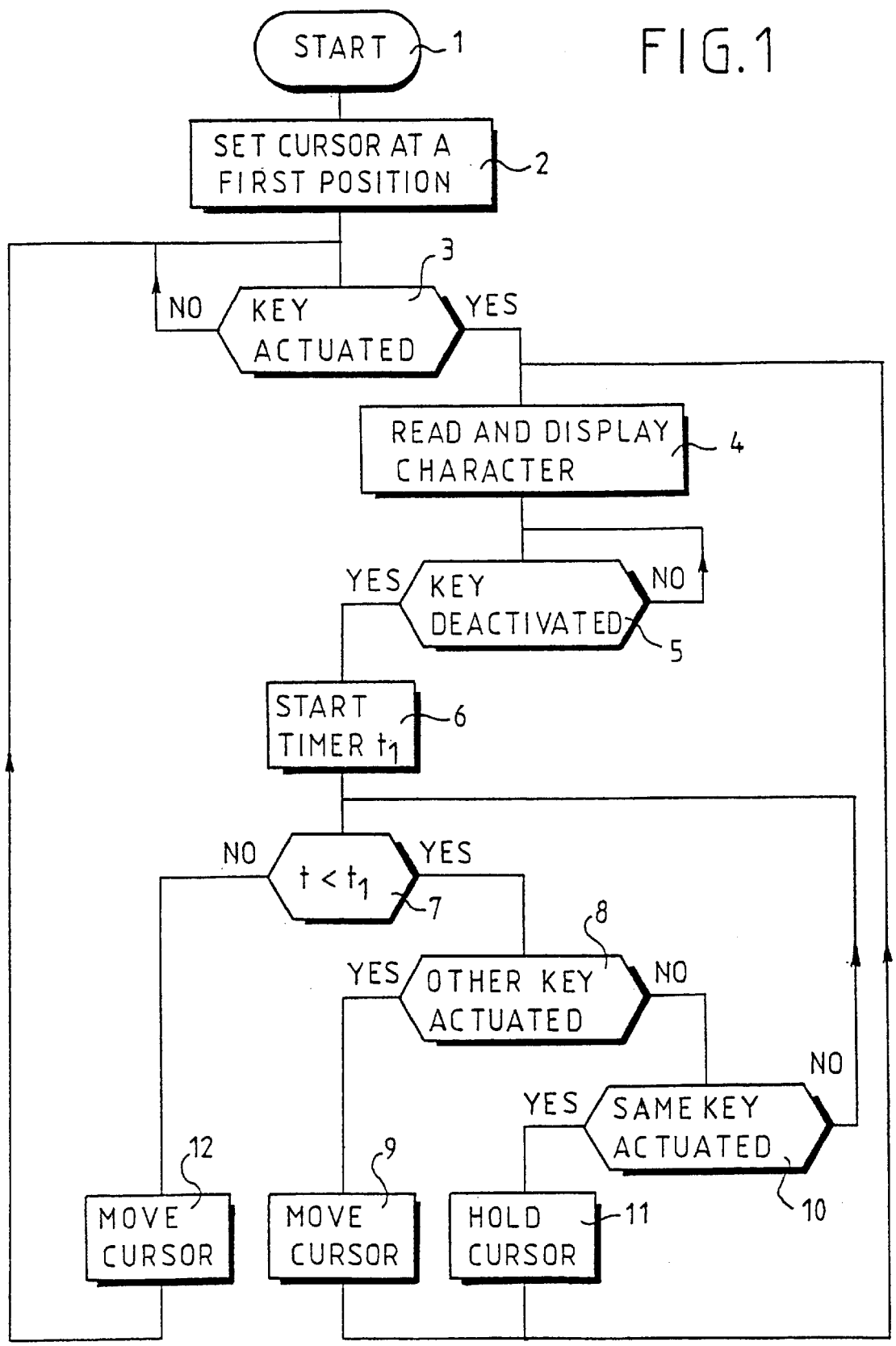
FIG. 1 shows a flow chart illustrating cursor controlled formation of a character string using an extended keypad means.

FIG. 1 shows a simplified flow chart diagram illustrating the cursor controlled selection of a character string using the above-mentioned keypad means. Note that the character string to be selected may be comprised of one single character. In this flow chart diagram it is assumed that the flow direction is from the top of the chart, i.e. block 1 indicated with "START", to the bottom of the chart. Any flow other than the assumed direction is indicated with an upwardly directed arrow.

After start of the character selection mode, the cursor is positioned at a first position, normally the most left position on the display, i.e. the first character of a string, such as indicated by block 2 "SET CURSOR AT A FIRST POSITION". At block 3 "KEY ACTUATED", actuation of a key of the keypad means is sensed for. In the case of push buttons, this will be the pressing of a button. However, in case of other keypad means such as capacitively detunable actuation means, actuation can be simply achieved by manually touching a conductive patch or other capacitively loaded surface representing a key. As long as no key is activated, block 3 "NO", the cursor remains at its first position.

Actuation of a key, block 3 "YES", results in a display of the first character of the group of characters assigned to the particular key, i.e. block 4 "READ AND DISPLAY CHARACTER". Deactivation of the key is sensed at block 5, "KEY DEACTIVATED". As long as a particular key has not been deactivated, the display will not be altered. This feature provides the user time to search for a particular key at the keypad means to which the next character to be selected is assigned. Deactivation of the key, block 5 "YES", results in the start of a timer, block 6 "START TIMER $t_1$".

Lapse of the set time interval $t_1$ is sensed for at block 7, "$t<t_1$". During the set time interval, block 7 "YES", it is sensed whether already another key has been actuated, such to select a next character of a string to be formed; i.e. block 8 "OTHER KEY ACTUATED". In the affirmative, "YES", the cursor has to be moved to its next position, block 9 "MOVE CURSOR", and the character corresponding to the actuation of a particular key will be read and displayed at block 4.

When no other key has been actuated, block 8 "NO", it is sensed whether the same key has been actuated again. For example in case the user wishes to select another character of the group; i.e. block 10 "SAME KEY ACTUATED". Actuation of the respective key within the time interval $t_1$, block 10 "YES", is interpreted as an amendment of the present character. Such that the cursor must not be moved to its next position in a string, block 11 "HOLD CURSOR". The selected new character of the group will be displayed at block 4.

When neither another key nor the same key has been actuated within the time interval $t_1$, i.e. block 8 "NO" and block 10 "NO", the cursor will be automatically moved after lapse of the set time interval, block 7 "NO". Movement of the cursor after the set time interval $t_1$ is carried out at block 12 "MOVE CURSOR", such that the actuation of a next key is sensed for at block 3.

The string of selected characters may be used for a number of purposes, such as memory access, storage of inputted data in a memory, activation of control processes etc. Although for reasons of clarity not shown in the flow chart diagram of FIG. 1, at several stages of the selection process a general time-out timer may be set, such to have an opportunity to escape from the selection process in case actuation of a key at block 3 takes a too long time, for example. Further, the selection process may be terminated in case the maximum length of a string has been achieved.

In the preferred embodiment of the method of the invention, the time interval $t_1$ is set to 0.5 seconds. It will be understood that the time interval $t_1$ can also be set at the actuation of a key at block 3. This is, for example, applicable in cases wherein the time interval during which a key is actuated is not under direct control of the user.

The method described is also suitable for use with character selection by scrolling through a particular group. Such that the characters of a group are alternately displayed during the time a particular key is actuated or in which scrolling is started by a first actuation of the key and has to be stopped by another actuation of the same key. The character selected is dependent on the time lapsed after start of the actuation of a key.

Figure 2:
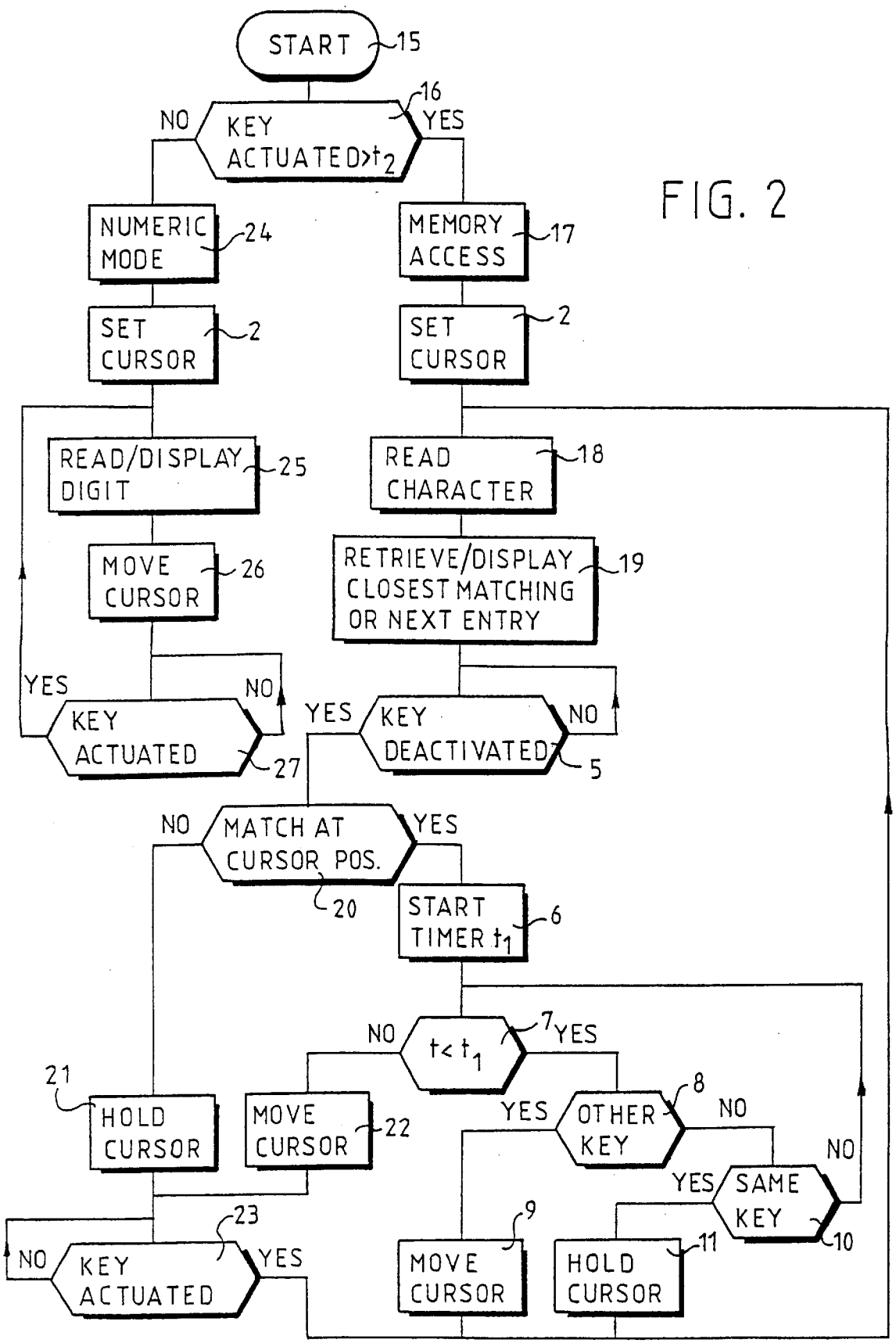
FIG. 2 shows a flow chart illustrating the memory controlled selection of a character string following the method of the invention.

FIG. 2 is a flow chart diagram of an embodiment of the method according to the invention, showing memory controlled character selection based on the method described above in connection with FIG. 1. For convenience sake, in this flow chart diagram, blocks having the same function a shown in FIG. 1 are indicated with like reference numerals.

FIG. 2 shows also the selection of a numeric string, independent of the memory controlled selection mode. A choice between either the memory controlled selection mode or the numeric mode depends, in the embodiment shown, on the time of actuation of the first key. Starting at block 15 "START", actuation of the first key sets a timer $t_2$ (not shown). If the first key is actuated longer than a time interval $t_2$, block 16 "KEY ACTUATED>$t_2$", "YES", the memory controlled selection mode is entered. Otherwise, the numeric mode will be entered, block 16 "NO".

Entering the memory controlled selection mode results in access to a memory or database comprising character representing data entries, i.e. block 17 "MEMORY ACCESS".

It is assumed that these data entries are accessible in an alphabetical order. The cursor is set at a first position, block 2, and the character corresponding to a particular key actuation is read, block 18 "READ CHARACTER". This character is used for retrieval of the closest matching data entry from the memory. In the preferred embodiment shown, in case of no matching data entries, the next data entry will be retrieved and displayed; i.e. block 19 "RETRIEVE/DISPLAY CLOSEST MATCHING OR NEXT ENTRY".

As long as the particular key is not deactivated, no cursor movement will take place, block 5 "NO". After deactivation of the key, block 5 "YES", there is made a comparison at the present cursor position whether the character read at block 18 matches the corresponding character of the selected data entry; block 20 "MATCH AT CURSOR POS.". In the affirmative, block 20 "YES", the cursor has to be moved to its next position, such to facilitate a further selection among a group of matching data entries, if any.

This cursor movement is made, however, dependent on a time interval $t_1$ within which another character can be selected, such as disclosed above in connection with FIG. 1, i.e. blocks 6–11. Selection of a new character will result in the retrieval and display of a new closest or next matching entry, i.e. blocks 18 and 19, etc. When during the time interval $t_1$ no selection has been made, the cursor will be moved, block 22 "MOVE CURSOR", such to sense for a new key actuation at block 23 "KEY ACTUATED". Actuation of a key, block 23 "YES", will result in reading the corresponding character at block 18 etc. such to retrieve a particular data entry.

In case of non matching characters at the cursor position, block 20 "NO", the cursor will not be moved, block 21 "HOLD CURSOR", and the method will sense for the activation of a next key at block 23. Block 23 represents, in fact, a waiting loop as long as no next key has been activated, i.e. block 23 "NO".

With the above memory controlled character selection, the cursor will only be moved to a next position in case a retrieved data entry matches to a particular selected character string. This allows for a fast, convenient and easy to handle access of data entries using a keypad means to each key of which a group of characters has been assigned. The retrieved data entry can be used, inter alia, for direct dialling purposes when used in a telephone set having memory means comprising, in addition to the subscriber names, also their extension numbers.

The present method provides also for conventional dialling, i.e. by inputting a string of digits representing a subscriber number. To this end, the numeric mode has to be entered as described above. After entering the numeric mode, block 24 "NUMERIC MODE", the cursor is set at a first position, block 2, From now on, only the characters representing the digits 0–9 and the special characters "*" and "#" can be selected by the keypad means. Each time a character has been read and displayed, the cursor is moved to its next position, block 25 "READ/DISPLAY DIGIT" and block 26 "MOVE CURSOR", respectively. Actuation of a next key is sensed at block 27 "KEY ACTUATED".

Although not shown, in both the memory access mode and the numeric mode, at several stages, timers can be set to provide an escape in case of unduly long selection times or otherwise. Such as described above in connection with FIG. 1. In a preferred embodiment of the invention, the time interval $t_2$ is set to 0.5 seconds.

Further, as an overall control of the cursor, such to have the opportunity to correct any mistakes in a character string or for scrolling through the memory content, for example, separate forward and backward keys may be provided.

Figure 3:
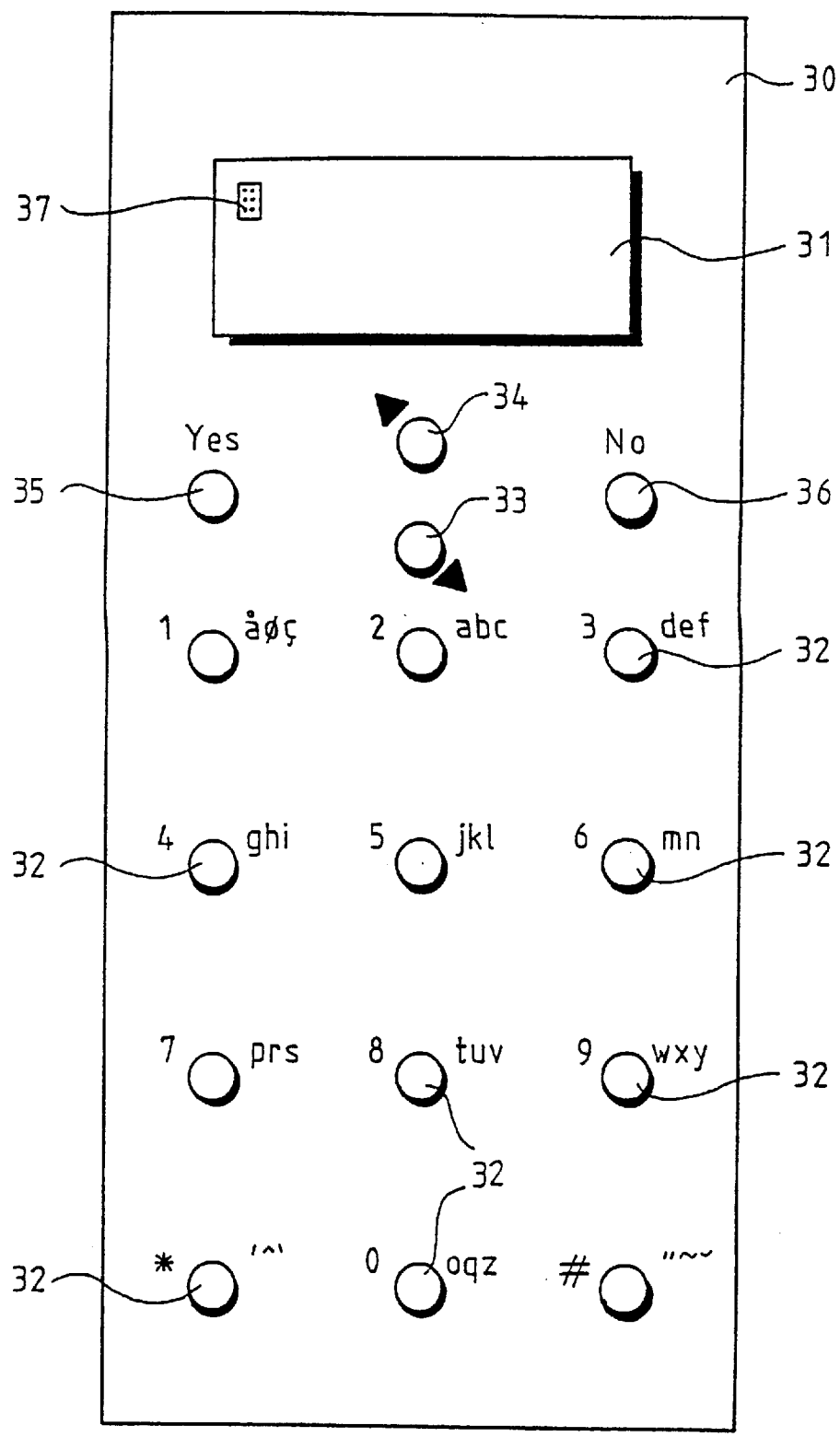
FIG. 3 shows, in a schematic and illustrative manner, a plan view of an enhanced keypad means for telephone dialling and information retrieval purposes.

FIG. 3 shows an enhanced keypad means 30 of the push button type, including display means 31, such as used for telephone dialling purposes. The keypad 30 comprises twelve keys 32 to each of which three or four characters are assigned, such as shown. The keypad 30 forms part of a menu-controlled telephone set, comprising a memory containing character data entries and operation and control information for the telephone set. By scrolling through the menu, several items to be selected are displayed on the display 31. Scrolling is performed using the arrow keys 33 and 34, such to scroll forward and backward through the menu, respectively. An item can be selected using the "YES"-key 35. In case of mistakes or to escape from a particular item or a sub-menu, the "NO"-key 36 can be used.

In connection with the present invention, in the memory access mode, the arrow keys 33 and 34 are used for resetting the cursor to its first position. In the numeric mode, the arrow keys 33, 34 have to be used for entering spaces or for the deletion of a previous selection, respectively. In the so-called "CallName" menu mode, after completion of a selected character string or retrieval of an intended data entry, dialling is automatically established by actuating the "YES" key 35. Actuation of this key is comparable to the well known "off hook" key in radio telephone sets, for example. Reference numeral 37 denotes a cursor, taking the form of a rectangular patch.

Without the intention of a limitation, the invention will now be further explained by an embodiment of a telephone set for use with digital cordless communication systems designated CT2, CT2-CAI, CT3 and DECT (Digital Enhanced Cordless Telecommunications) and/or digital cellular communication systems designated IS-54B in North America and the pan-European GSM networks.

DECT is a standard for digital cordless radio telecommunication systems, i.e. for use in business environments such as offices and in residential areas, such as Radio in the Local Loop (RLL) and Cordless terminal Mobility (CTM) applications. DECT uses a Multi-Carrier (MC)/Time Division Multiple Access (TDMA)/Time Division Duplex (TDD) format for radio communication between the remote units such as cordless telephone sets and base-stations connected to a public or private switching network. With DECT, ten radio carriers are available. Each carrier is divided in the time domain into twenty-four 'time-slots'. Two time-slots are used to create a duplex speech channel, effectively resulting in twelve available speech channels at any of the ten radio carriers. The twenty-four time slots are transmitted in so-called TDMA frames having a frame cycle time $T_F$ of 10 ms.

Figure 4:
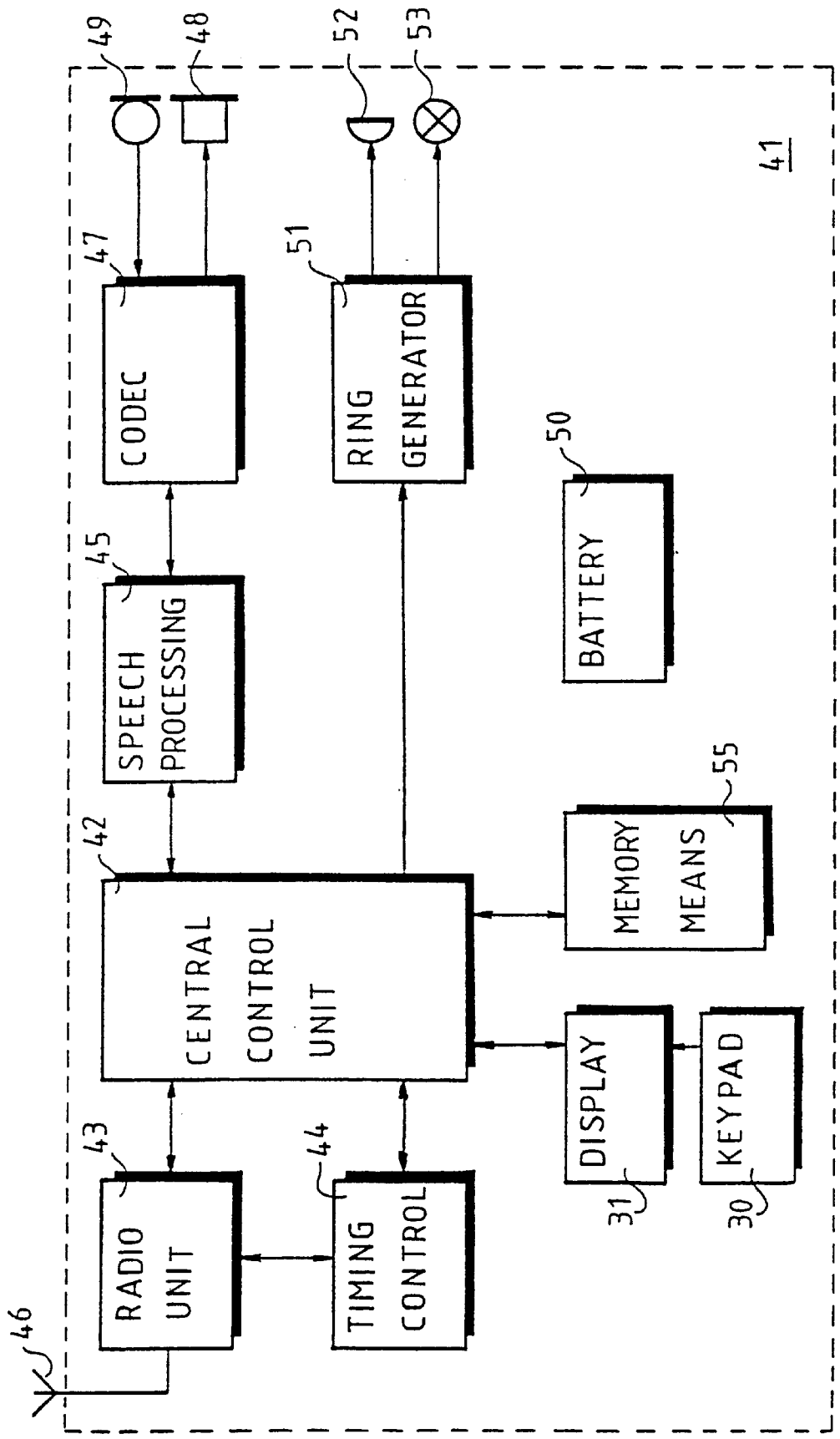
FIG. 4 shows a simplified block diagram of a radio telephone set in accordance with the present invention.

FIG. 4 shows a simplified block diagram of a radio telephone set 41, having four essential building blocks, i.e. a processor central control and application logic unit 42, a radio unit 43, a timing and synchronisation control unit 44 and a speech processing unit 45.

The radio unit 43 comprises an air interface in the form of an antenna 46 coupled to a transceiver unit comprising a transmitter/modulator and a receiver/demodulator. Transmission and reception timing is controlled by the timing control unit 44. In case of TDMA/TDD technology this timing control unit 44 controls, among others, frame and time slot synchronisation. Timing reference is either internally generated or derived from a synchronisation signal received over the antenna 46.

The central control unit 42 receives data from the radio unit 43. Signalling and synchronisation information is removed from the received data such that only received speech data is fed to the speech processing unit 45. The speech processing unit 45, among others, takes care for the deciphering of received data, if applicable. A codec 47 decodes the received digitized speech data into analog form for making it audible to a user of the telephone set via a loudspeaker 48 connected to the codec 47.

Speech produced by the user is received by a microphone 49 and encoded into a suitable digital format by the codec 47. This encoded speech data is fed to the speech processing unit 45 which, among others, takes care for encryption of the speech data. The central control unit 42 adds suitable synchronisation and signalling information to the encrypted speech data. The radio unit 43 transmits this signalling and speech data via the antenna 46 for reception by a base station (not shown) of the communication system to which the telephone set 41 is connected.

In case of a multi-carrier multi-time-slot technology, such as DECT, the central control unit 42 controls the various combinations of carrier frequencies and time-slots.

Further, the telephone set 41 comprises a keypad 30 and a display 31, such as a Liquid Crystal Display (LCD), including means for storing displayed characters, which are connected to the central control unit 42, for control of the telephone by a user. Control data and character representing data entries are stored, in accordance with the invention, in a memory means 55, which is operatively connected to the central control unit 42.

The central control unit 42 detects incoming calls and controls outgoing calls, i.e by transmitting dialling information and the like. The arrival of a call is detected from suitable signalling information in a control and/or user data field of arriving data frames. At the detection of the arrival of a call, ring generator means 51 are actuated from the central control unit 42 for producing a ringing or alerting sound by a buzzer 52 and, optionally, a visual alerting signal emitted by a lamp or Light Emitting Diode (LED) 53. For the overall powering of the telephone set 41, a battery unit 50 is included.

FIG. 5 shows the memory means 55 in more detail. A microprocessor 54 included with or operatively connected to the central control unit 42 of FIG. 4 controls access to a first non-volatile memory part 56, for the retrieval and storage of pre-determined character data entries e.g. stored by the operator of a telephone system via a data interface or bus 59.

The microprocessor 54 controls also a second non-volatile memory part 57 for storing and retrieving character data inputted by the user of the telephone set via the keypad 30 by building a character string as disclosed in connection with FIG. 1, for example.

The microprocessor operates further on a third memory part 58 which, during operation of the telephone set, contains address data pointing towards the data entries in both the first and second memory parts 56, 57. The third memory part is a so-called volatile memory, e.g. a Random Access Memory (RAM). The software program for the operation of the microprocessor 54 and the control information with regard to the operation of the telephone set are included in the first memory part 56.

The first memory part 56 is, in a preferred embodiment of the invention, a so-called flash Electrically Erasable and Programmable Read Only Memory (EEPROM), having a parallel data input and output bus. The second memory part is a serial EEPROM, having a serial data bus connected to the processor 54. For a skilled person it will be clear that the second memory part 57 may also form part of the flash memory 56, provided that the battery 50 of the telephone set suits the voltages and power required for the erasure and programming of the flash memory.

Each time the telephone set is switched on or when a data entry has been added or amended by the user of the telephone, a sorting algorithm is executed, such that the addresses of the several character representing data entries in both memory parts 56, 57 are stored in the third memory part 58 corresponding to an alphabetically ordering of the data entries. The table of addresses produced is indicated with reference numeral 60. The several addresses are represented by reference numeral 61.

Data entries stored in the memory parts 56, 57 are accessed and retrieved in accordance with the method described above, using this common address table or pointer list 60. The users do not have to choose between entries stored in the one or the other memory part. This is an great advantage viewed in the light of limiting the number of key actuations and provides, of course, increased user handling convenience of the telephone set.

For the purpose of the present invention, there are also shown key actuation/deactivation sensing means 62, timer means 63 setting one or both of the timers $t_1$ and $t_2$, and means 64, operative for putting a call in progress automatically on hold, while dialling for a third party. Note that the function of these means 62, 63 and 64 may be also implemented in the processor 54.

It will be understood that the present invention is not limited to a radio telephone set, neither to a digital radio set. The method disclosed may be used in any conventional wired digital and analogues telephone set, such as well known in the art.

It is claimed:

1. A method of selecting characters from a group of characters assigned to a single key, in particular a key of a telephone dialing keypad each key of which having a number of alphanumeric and other characters assigned to it; the actuation of a key invokes a cursor controlled display of the characters assigned to said key; the cursor is held at its position while a particular key is actuated within a predetermined time interval; and the cursor is automatically moved to an other position if said key is not further actuated within said time interval such to form a character string comprising at least one character, wherein the selection of a character is controlled in connection with accessing character data entries stored in memory means, a data entry stored in said memory means is retrieved and displayed which matches closest to a selected character string, and said cursor is held at its position if the corresponding character of the retrieved data entry and the selected character at the cursor position do not match.

2. The method of claim 1, wherein if no data entries match said selected character string, the closest matching next data entry stored in said memory means is retrieved and displayed.

3. The method of claim 1, wherein said memory controlled character selection mode is entered by a time-controlled actuation of a key while the cursor is in a first position, said actuation is interpreted as a first selected character of a string.

4. The method of claim 1, further comprising the step of moving the cursor to said other position if an other key of said keypad is actuated.

5. The method of claim 1, wherein the cursor position is indicated in the form of a blinking display of a selected character.

6. A telephone set, in particular a radio telephone set, including processor control means, visual display means and telephone dialing keypad means, each key of said keypad means having a number of alphanumeric and other characters assigned to it, wherein said processor control means, keypad means and display means are operatively connected such that actuation of a key invokes a cursor controlled display of the characters assigned to said key, said telephone set comprises timer means for setting a predetermined time interval, such that under the control of said processor control means the cursor is held at a particular display position while a key of said keypad means is actuated during said time interval and wherein the cursor is moved to an other position if said key is not further actuated within said time interval, as a result of which a character string comprising at least one character is formed, wherein said telephone set comprises memory means operatively connected to said processor control means for retrieving character data entries stored in said memory means, and wherein the processor control means are arranged to hold the cursor at its position in case the selected character string does not match any of the data entries.

7. The telephone set of claim 6, wherein said memory means comprise a first non-volatile memory part allocated to pre-determined data entries, a second non-volatile memory part allocated to data entries from said keypad means, and a third memory part allocated to address data pointing in a predetermined manner to data entries of said first and second memory part, wherein during operation of said telephone set under the control of said processor control means and in accordance with a selected character string, data entries of said first and second memory part are accessed conditional to said address data.

8. The telephone set of claim 7, wherein said first memory part is a flash Electrically Erasable and Programmable Read Only Memory (EEPROM), said second non-volatile memory part is an Electrically Erasable Programmable Read Only Memory (EEPROM) and said third memory part is a volatile Random Access Memory (RAM).

9. The telephone set of claim 7, wherein said processor control means are arranged for updating said address data each time after a change of a data entry and at switching on of said telephone set.

10. The telephone set of claim 6, further comprising means for sensing actuation of another key of said keypad means for movement of the cursor to a further position under control of said processor control means.

11. The telephone set of claim 6, wherein said memory means are arranged for storing data entries representing at least names of subscribers of a telephone system to which said telephone set is connected, and wherein said address data is arranged to point to said names in an alphabetical order.

12. The telephone set of claim 6, comprising further timer means, wherein said memory controlled access is entered by a first actuation of a key under the control of said further timer means.

13. The telephone set of claim 12, wherein said processor control means are arranged such that if said key is actuated for character selection without entering said memory control mode, only numeric characters 0–9 and special characters "*" and "#" are assigned to the keys of said keypad means.

14. The telephone set of claim 6, further comprising means for exchanging dialing information, which means are operatively connected to said processor control means for transmitting dialing information retrieved from an accessed data entry.

15. The telephone set of claim 14, wherein said processor control means, memory means, keypad means and display means are arranged for selecting a character string and accessing a data entry while a call is in progress, and wherein by dialing in accordance with said selected character string or said accessed data entry the call in progress will be automatically put on hold.

16. A method for entering an input string of at least one alphanumeric character into a device, said device including a keypad with at least one key, each key corresponding to a set of at least one alphanumeric character, comprising the steps of:

displaying, upon actuation of one of said keys, a cursor and a next specific character corresponding to said one actuated key at a current cursor position of a display of said device;

selecting a most likely candidate string from a set of at least one candidate string stored in a memory of said device, wherein said most likely candidate string represents a closest match to said next specific character as compared to other candidate strings in said stored set of at least one candidate string;

displaying said most likely candidate string on said display of said device;

determining whether a particular character of said most likely candidate string is an exact match of said next specific character;

holding said current cursor position and awaiting an additional key actuation when said particular character of said most likely candidate string is not an exact match of said next specific character;

initiating a timer when said particular character of said most likely candidate string is an exact match of said next specific character;

accepting said next specific character as a potential character in said input string, advancing said current cursor position, and awaiting an additional key actuation when said one actuated key is not again actuated before said timer expires; and holding said current cursor position and returning to said step of displaying a cursor and a next specific character corresponding to said one actuated key when said one actuated key is again actuated before said timer expires.

17. A method according to claim 16, wherein said steps of awaiting an additional key actuation comprise the steps of:

displaying a cursor at said current cursor position;

displaying, upon actuation of an additional one of said keys, a next specific character corresponding to said additional one of said keys at said current cursor position; and returning to said step of selecting a most likely candidate string.

18. A method according to claim 16, including the step of:

accepting said next specific character as a potential character in said input string, advancing said current cursor position, displaying a cursor and a next specific character corresponding to another one of said keys at said current cursor position and returning to said step of selecting a most likely candidate string when another one of said keys is actuated before said timer expires.

* * * * *